(12) United States Patent
Yamaguchi et al.

(10) Patent No.: US 7,455,734 B2
(45) Date of Patent: Nov. 25, 2008

(54) SUBSTRATE PROCESSING APPARATUS, SUBSTRATE HOLDER, AND MANUFACTURING METHOD OF SEMICONDUCTOR DEVICE

(75) Inventors: Takatomo Yamaguchi, Toyama (JP); Kazuhiro Morimitsu, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/574,568

(22) PCT Filed: Nov. 29, 2004

(86) PCT No.: PCT/JP2004/017723

§ 371 (c)(1),
(2), (4) Date: Aug. 7, 2006

(87) PCT Pub. No.: WO2005/053016

PCT Pub. Date: Jun. 9, 2005

(65) Prior Publication Data

US 2007/0007646 A1 Jan. 11, 2007

(30) Foreign Application Priority Data

Nov. 27, 2003 (JP) .............................. 2003-397743

(51) Int. Cl.
*C23C 16/00* (2006.01)
(52) U.S. Cl. .................................................. 118/728
(58) Field of Classification Search ................. 118/728
See application file for complete search history.

(56) References Cited

U.S. PATENT DOCUMENTS 4,745,088 A * 5/1988 Inoue et al. .................. 117/98
5,169,684 A * 12/1992 Takagi ...................... 427/248.1
5,316,472 A * 5/1994 Niino et al. ................ 432/241
5,651,670 A * 7/1997 Okase et al. ................... 432/5
5,743,967 A 4/1998 Kobori et al.

(Continued)

FOREIGN PATENT DOCUMENTS

JP        A 4-2118       1/1992

(Continued)

OTHER PUBLICATIONS

English translation of JP 04-002118, Inventor Niino Rejii, Jul. 01, 1992.*

*Primary Examiner*—Michael Cleveland
*Assistant Examiner*—Keath Chen
(74) *Attorney, Agent, or Firm*—Oliff & Berridge, PLC

(57) ABSTRACT

A nonuniform portion of a film thickness on a substrate owing to effects of a support column, a substrate mounting portion, and the like which constitute a substrate holder is eliminated, and uniformity of the film thickness of the substrate is enhanced.

A substrate processing apparatus houses plural wafers (substrates) held on a boat (substrate holder) in a processing chamber, supplying processing gas to the heated processing chamber, thereby performing film-forming processing for the wafers. The boat includes: at least three support columns 15 provided substantially vertically; plural wafer support portions 16 (substrate mounting portions) which are provided at multi-stages on the support columns and mount the plural wafers substantially horizontally at a predetermined interval; and plural ring-like plates 13 arranged on the support columns 15, and provided substantially horizontally at a predetermined interval with respect to the wafers supported on the wafer support portions 16.

22 Claims, 10 Drawing Sheets

U.S. PATENT DOCUMENTS

| | | | |
|---|---|---|---|
| 5,820,683 A * | 10/1998 | Ishii et al. | 118/728 |
| 6,287,112 B1 * | 9/2001 | Van Voorst Vader et al. | 432/258 |
| 2002/0070095 A1 * | 6/2002 | Osaka et al. | 198/394 |
| 2003/0077150 A1 * | 4/2003 | Matsuda et al. | 414/217 |
| 2004/0099219 A1 * | 5/2004 | Park et al. | 118/728 |

FOREIGN PATENT DOCUMENTS

| | | |
|---|---|---|
| JP | A 9-92623 | 4/1997 |
| JP | A 10-41236 | 2/1998 |
| JP | A 10-233368 | 9/1998 |
| JP | A 11-40509 | 2/1999 |
| JP | A 2001-168175 | 6/2001 |

* cited by examiner (a)

(b)

LOADING / UNLOADING
DIRECTION OF WAFER

SUBSTRATE PROCESSING APPARATUS, SUBSTRATE HOLDER, AND MANUFACTURING METHOD OF SEMICONDUCTOR DEVICE

TECHNICAL FIELD

The present invention relates to a substrate processing apparatus, a substrate holder, and a manufacturing method of a semiconductor device, and particularly, to a substrate processing apparatus, a substrate holder, and a manufacturing method of a semiconductor device, in which uniformity of a throughput in a surface of a substrate is improved.

BACKGROUND ART

Heretofore, in a vertical CVD apparatus and the like, a boat having holder plates has been used as a substrate holder which holds plural wafers (for example, Patent Document 1). As shown in FIG. 15 and FIG. 16, the boat has four support columns 32 provided vertically. The support columns are arranged in a range of an approximate semi-circumference so as to make it possible to load and unload the wafers. Ring-like quartz-made holder plates 33 are welded in a horizontal attitude at multi-stages to groove portions (not shown) provided on the support columns 32. On an upper surface of each holder plate 33, plural support claw portions 34 are provided as substrate mounting portions which mount the wafer thereon.

When wafer processing, for example, film forming is performed on the wafers by using the boat as described above, the quartz-made holder plates 33 uniform a flow of processing gas on surfaces of the wafers, thus making it possible to restrict only a film thickness of ends of the wafers from being thickened. Moreover, the wafers are held on the support claw portions 34 provided on the holder plates 33 more inside than the four support columns 32 arranged on the approximate semi-circumference. Accordingly, a distance between the columns 32 and the wafers is lengthened. Therefore, an effect of the support columns 32 is reduced, thus making it possible to enhance uniformity of the film thickness.

Patent Document 1: Japanese Patent Laid-Open Publication No. H11-40509 (FIG. 5, FIG. 6, FIG. 7, FIG. 10)

DISCLOSURE OF THE INVENTION

Problems to be Solved by the Invention

However, even if the conventional boat described above is used, the support columns and wafer support portions constitute portions where the flow of the processing gas is nonuniform, and accordingly, the effect of these support columns and the wafer support portions cannot be eliminated. Also in a result of the wafer processing, a throughput on the wafer portions corresponding to the support columns and the wafer support portions has had a tendency to be decreased.

It is an object of the present invention to provide a substrate processing apparatus, a substrate holder, and a manufacturing method of a semiconductor device, which are capable of solving the above-described problems in the conventional technology, eliminating the nonuniform portions of the substrate throughput on the substrate surfaces owing to the effect from the support columns and the substrate mounting portions, both constituting the substrate holder, and enhancing the uniformity of the film thickness in the substrate surfaces.

Means for Solving the Problems

A first invention is a substrate processing apparatus, comprising: a substrate holder capable of holding plural substrates; a processing chamber which houses the substrates held by the substrate holder; heating means for heating the processing chamber; and gas supplying means for supplying processing gas to the processing chamber heated by the heating means, thereby processing the substrate, wherein the substrate holder includes: at least three support columns provided substantially vertically; plural substrate mounting portions which mount the plural substrates substantially horizontally at a predetermined interval, the substrate mounting portions being provided at multi-stages on the support columns; and plural ring-like plates arranged on the support columns, and provided substantially horizontally at a predetermined interval with respect to the substrates supported on the substrate mounting portions.

The substrates are housed in the processing chamber heated by the heating means in a state of being held on the substrate holder. Here, since the substrate holder which holds the substrates includes the at least three support columns, the substrate holder can stably hold the substrates. Moreover, since the ring-like plates are provided on the support columns, a throughput of peripheral edges of the substrates can be restricted from being increased. Furthermore, the substrate mounting portions are provided not on the ring-like plates but on the support columns, and the support columns and the substrate mounting portions are thus integrated together. Thus, an adverse effect to a substrate throughput, which is given by the support columns and the substrate support portions, can be reduced. Hence, the in-plane uniformity of the substrate throughput can be improved.

Note that the predetermined interval of the "ring-like plates provided substantially horizontally at a predetermined interval with respect to the substrates" includes a value of zero, specifically, includes that upper surfaces of the substrates and upper surfaces of the ring-like plates coincide with each other, that is, both of the surfaces become flush with each other.

A second invention is the substrate processing apparatus in the first invention, wherein the substrate mounting portions are columnar or approximately semi-columnar in cross section.

Although it is possible to form the substrate mounting portions into concave portions by providing grooves on the support columns, the substrate mounting portions should be formed into convex portions protruded from the support columns. It is preferable that the convex portions be columnar or approximately semi-columnar in cross section. In the case of the approximately semi-columnar shape in cross section, an arc side thereof is set as the substrate mounting surfaces. In such a way, contact of the substrate mounting portions with the substrates becomes line contact, and the generation of the particles can be reduced. Note that, in the case of protruding the wafer mounting portions on the support columns, though the substrate mounting portions may be formed separately from the support columns and attached onto the support columns, the substrate mounting portions may be formed integrally with the support columns.

A third invention is the substrate processing apparatus in the second invention, wherein the substrate mounting portions are inclined downward toward an inside of the ring-like plates in a diameter direction. In such a way, the contact of the substrate mounting portions with the substrates becomes point contact, and the generation of the particles can be further reduced.

A fourth invention is the substrate processing apparatus in the first invention, wherein inner circumferential surfaces of the ring-like plates, the inner circumferential surfaces being opposite to the support columns, are notched on a periphery of the support columns. When the inner circumferential surfaces of the ring-like plates are notched on the periphery of the support columns, it becomes easy for the processing gas to flow on the periphery of the support columns, and uniformity of the flow of the processing gas to the substrates can be achieved between portions where the support columns are present and portions where the support columns are not present. Hence, the in-plane uniformity of the substrate throughput can be improved.

A fifth invention is the substrate processing apparatus in the fourth invention, wherein the substrate mounting portions are columnar or approximately semi-columnar in cross section. In such a way, the contact of the substrate mounting portions with the substrates becomes the line contact, and the generation of the particles can be reduced.

A sixth invention is the substrate processing apparatus in the fifth invention, wherein tips of the substrate mounting portions are rounded or chamfered. In such a way, the contact of the substrate mounting portions with the substrates becomes the line contact, and the generation of the particles can be reduced.

A seventh invention is the substrate processing apparatus in the sixth invention, wherein the substrate mounting portions are inclined downward toward an inside of the ring-like plates in a diameter direction. In such a way, the contact of the substrate mounting portions with the substrates becomes the point contact, and the generation of the particles can be further reduced.

An eighth invention is the substrate processing apparatus in the fourth invention, wherein the support columns are composed into an approximately semi-columnar shape in cross section, and the substrate mounting portions are protruded on a chord side of the support columns. In such a way, interference of the gas flow, which is caused by the support columns and the substrate mounting portions, can be reduced, and a flow rate of the processing gas flowing in the vicinities of the support columns and the substrate mounting portions can be increased. Note that the support columns may be composed into a half-pipe shape, and that the substrate mounting portions may be protruded on a concave portion side thereof.

A ninth invention is the substrate processing apparatus in the eighth invention, wherein, on the chord side, an inside thereof in a diameter direction of the ring-like plates is scooped out. In such a way, the flow rate of the processing gas flowing in the vicinities of the support columns and the substrate mounting portions can be further increased.

A tenth invention is the substrate processing apparatus in the fourth invention, wherein the support columns are provided more inside than outer circumferences of the ring-like plates. In such a way, it is made possible to maintain the gap between the support columns and the processing chamber far more appropriately.

An eleventh invention is a substrate processing apparatus, comprising: a substrate holder capable of holding plural substrates; a processing chamber which houses the substrates held by the substrate holder; heating means for heating the processing chamber; and gas supplying means for supplying processing gas to the processing chamber heated by the heating means, thereby processing the substrate, wherein the substrate holder includes: at least three support columns provided substantially vertically; and plural ring-like plates which surround the at least three support columns, are provided at multi-stages on the support columns, and are provided substantially horizontally at a predetermined interval with respect to the substrates held by the substrate holder, and inner circumferential surfaces of the ring-like plates, the inner circumferential surfaces being opposite to the support columns, are notched on a periphery of the support columns.

Here, since the substrate holder which holds the substrates includes the at least three support columns, the substrate holder can stably hold the substrates. Moreover, since the ring-like plates are provided on the support columns, the throughput of the peripheral edges of the substrates can be restricted from being increased. Furthermore, since the inner circumferential surfaces of the ring-like plates are notched on the periphery of the support columns, it becomes easy for the processing gas to flow on the periphery of the support columns, and the uniformity of the flow of the processing gas to the substrates can be achieved between the portions where the support columns are present and the portions where the support columns are not present. Hence, the in-plane uniformity of the substrate throughput can be improved.

Note that the predetermined interval of the "ring-like plates provided substantially horizontally at a predetermined interval with respect to the substrates" includes the value of zero, specifically, includes that the upper surfaces of the substrates and the upper surfaces of the ring-like plates coincide with each other, that is, both of the surfaces become flush with each other.

Moreover, in the eleventh invention, holes for fitting the ring-like plates to the support columns are provided, the holes are opened to the inner circumferential surface side of the ring-like plates, and the inner circumferential surfaces of the ring-like plates may be thus notched on the periphery of the support columns. Moreover, the substrate mounting portions in the substrate holder capable of holding the plural substrates may be provided either on the support columns or on the ring-like plates.

A twelfth invention is the substrate processing apparatus in the eleventh invention, wherein the support columns are composed into an approximately semi-columnar shape in cross section, and the substrate mounting portions are protruded on a chord side of the support columns. In such a way, the interference of the gas flow, which is caused by the support columns and the substrate mounting portions, can be reduced, and the flow rate of the processing gas flowing in the vicinities of the support columns and the substrate mounting portions can be increased.

A thirteenth invention is the substrate processing apparatus in the eleventh invention, wherein the support columns are provided more inside than outer circumferences of the ring-like plates. In such a way, it is made possible to maintain the gap between the support columns and the processing chamber far more appropriately.

A fourteenth invention is the substrate processing apparatus in the twelfth invention, wherein, on the chord side, an inside thereof in a diameter direction of the ring-like plates is scooped out. In such a way, the flow rate of the processing gas flowing in the vicinities of the support columns and the substrate mounting portions can be further increased.

A fifteenth invention is a substrate holder capable of holding plural substrates, comprising: at least three support columns provided substantially vertically; plural substrate mounting portions which mount the plural substrates substantially horizontally at a predetermined interval, the substrate mounting portions being provided at multi-stages on the support columns; and plural ring-like plates arranged on the support columns, and provided substantially horizontally at a predetermined interval with respect to the substrates supported on the substrate mounting portions.

Since the substrate holder which holds the substrates includes the at least three support columns, the substrate holder can stably hold the substrates. Moreover, since the ring-like plates are provided on the support columns, the throughput of the peripheral edges of the substrates can be restricted from being increased. Furthermore, the substrate mounting portions are provided not on the ring-like plates but on the support columns, and the support columns and the substrate mounting portions are thus integrated together. Thus, the adverse effect to the substrate throughput, which is given by the support columns and the substrate support portions, can be reduced. Hence, the in-plane uniformity of the substrate throughput can be improved.

Note that the predetermined interval of the "ring-like plates provided substantially horizontally at a predetermined interval with respect to the substrates" includes the value of zero, specifically, includes that the upper surfaces of the substrates and the upper surfaces of the ring-like plates coincide with each other, that is, both of the surfaces become flush with each other.

A sixteenth invention is the substrate holder in the fifteenth invention, wherein inner circumferential surfaces of the ring-like plates, the inner circumferential surfaces being opposite to the support columns, are notched on a periphery of the support columns. In such a way, it becomes easy for the processing gas to flow on the periphery of the support columns, and the uniformity of the flow of the processing gas to the substrates can be achieved between the portions where the support columns are present and the portions where the support columns are not present.

A seventeenth invention is a substrate holder capable of holding plural substrates, comprising: at least three support columns provided substantially vertically; and plural ring-like plates which surround the at least three support columns, are provided at multi-stages on the support columns, and are provided substantially horizontally at a predetermined interval with respect to the substrates held by the substrate holder, wherein inner circumferential surfaces of the ring-like plates, the inner circumferential surfaces being opposite to the support columns, are notched on a periphery of the support columns.

Since the substrate holder which holds the substrates includes the at least three support columns, the substrate holder can stably hold the substrates. Moreover, since the ring-like plates are provided on the support columns, the throughput of the peripheral edges of the substrates can be restricted from being increased. Furthermore, since the inner circumferential surfaces of the ring-like plates are notched on the periphery of the support columns, it becomes easy for the processing gas to flow on the periphery of the support columns, and the uniformity of the flow of the processing gas to the substrates can be achieved between the portions where the support columns are present and the portions where the support columns are not present. Hence, the in-plane uniformity of the substrate throughput can be improved.

Note that the predetermined interval of the "ring-like plates provided substantially horizontally at a predetermined interval with respect to the substrates" includes a value of zero, specifically, includes that the upper surfaces of the substrates and the upper surfaces of the ring-like plates coincide with each other, that is, both of the surfaces become flush with each other.

An eleventh invention is a method of manufacturing a semiconductor device, the method using a substrate processing apparatus including: a substrate holder capable of holding plural substrates; a processing chamber which houses the substrates held by the substrate holder; heating means for heating the processing chamber; and gas supplying means for supplying processing gas to the processing chamber heated by the heating means, thereby processing the substrate, in which the substrate holder includes: at least three support columns provided substantially vertically; plural substrate mounting portions which mount the plural substrates substantially horizontally at a predetermined interval, the substrate mounting portions being provided at multi-stages on the support columns; and plural ring-like plates arranged on the support columns, and provided substantially horizontally at a predetermined interval with respect to the substrates supported on the substrate mounting portions, the method comprising the steps of: mounting the substrates on the substrate mounting portions of the substrate holder; carrying the substrates mounted on the substrate mounting portions of the substrate holder into the processing chamber; heating the processing chamber by the heating means; and supplying the processing gas to the heated processing chamber, thereby processing the substrate.

The plural substrates are mounted on the substrate mounting portions, thereby being held on the substrate holder. The substrate holder on which the plural substrates are held is carried into the processing chamber. The processing chamber is heated by the heating means, the processing gas is supplied to the heated processing chamber, and the plural substrates held on the substrate holder are processed. Here, since the substrate holder which holds the substrates includes the at least three support columns, the substrate holder can stably hold the substrates. Moreover, since the ring-like plates are provided on the support columns, the throughput of the peripheral edges of the substrates can be restricted from being increased. Furthermore, the substrate mounting portions are provided not on the ring-like plates but on the support columns, and the support columns and the substrate mounting portions are thus integrated together. Thus, the adverse effect to the substrate throughput, which is given by the support columns and the substrate support portions, can be reduced. Hence, the in-plane uniformity of the substrate throughput can be improved.

Note that the predetermined interval of the "ring-like plates provided substantially horizontally at a predetermined interval with respect to the substrates" includes the value of zero, specifically, includes that the upper surfaces of the substrates and the upper surfaces of the ring-like plates coincide with each other, that is, both of the surfaces become flush with each other.

Effect of the Invention

According to the present invention, nonuniform portions of the substrate throughput in the substrate surfaces owing to the effects of the support columns, the substrate mounting portions, and the like which constitute the substrate holder can be eliminated, and the uniformity of the film thickness in the substrate surfaces can be enhanced. Hence, enhancements of yield and quality in manufacture of the semiconductor device can be achieved.

BEST MODE FOR CARRYING OUT THE INVENTION

A description will be made below of an embodiment in which a substrate processing apparatus, a substrate holder, and a manufacturing method of a semiconductor device according to the present invention are applied to a semiconductor manufacturing apparatus including a vertical furnace.

FIG. 11 is a schematic view of the semiconductor manufacturing apparatus including the vertical furnace, and FIG. 12 is a cross-sectional view of a reduced-pressure CVD processing furnace as the vertical furnace. As shown in FIG. 11, a cassette loader 6 is located on a front side in an inside of a cabinet 10, and a cassette shelf 1 is provided on a back side of the cassette loader 6. A buffer cassette shelf 7 is provided above the cassette shelf 1, and a wafer transfer machine 2 is provided on a back side of the cassette shelf 1. A boat elevator 8 which elevates and lowers a boat 217 is provided on a back side of the wafer transfer machine 2, and a vertical furnace 5 is provided above the boat elevator 8.

As shown in FIG. 12, the vertical furnace 5 includes an outer pipe (hereinafter, an outer tube 205), and an inner pipe (hereinafter, an inner tube 204). The outer tube 205 is formed of a heat resistant material such as, for example, quarts ($SiO_2$) and the like, and has a cylindrical form in which an upper end is closed and an opening is provided on a lower end. The inner tube 204 has a cylindrical form in which openings are provided on both of upper and lower ends, and is disposed in the outer tube 205 coaxially therewith. A space between the outer tube 205 and the inner tube 204 forms a tubular space 250. Gas elevated from the upper opening of the inner tube 204 passes through the tubular space 250, and is emitted from an exhaust pipe 231.

A manifold 209 formed of, for example, stainless steel and the like is engaged with the lower ends of the outer tube 205 and the inner tube 204, and the outer tube 205 and the inner tube 204 are held on the manifold 209. The manifold 209 is fixed to holding means (hereinafter, a heater base 251). Annular flanges are individually provided on the lower end of the outer tube 205 and an upper opening end of the manifold 209. A hermetically sealing member (hereinafter, an O-ring 220) is disposed between these flanges, and both of the flanges are hermetically sealed.

Onto a lower opening of the manifold 209, a disk-like cap member (hereinafter, a seal cap 219) formed of, for example, stainless steel and the like is attached through the O-ring 220 so as to be capable of hermetically sealing the lower opening and to be freely detachable therefrom. To the seal cap 219, a gas supply pipe 232 as gas supplying means is provided so as to penetrate therethrough. By the gas supply pipe 232, the processing gas is supplied into the inner tube 204. The gas supply pipe 232 is coupled to flow rate controlling means (hereinafter, a mass flow controller (MFC) 241) for the gas, and the MFC 241 is connected to a gas flow rate control unit 122 of a second controlling computer 120, thus making it possible to control a flow rate of the processing gas to be supplied at a predetermined value.

To an upper portion of the manifold 209, there is connected a gas exhaust pipe 231 to which a pressure regulator (including an APC, and an N2 ballast controller, and hereinafter, referred to as an APC 242) and an exhaust device (hereinafter, a vacuum pump 246) are coupled. Thus, the gas flowing in the tubular space 250 between the outer tube 205 and the inner tube 204 is emitted, and a pressure in the outer tube 205 is controlled by the APC 242. Thus, the pressure is detected by pressure detecting means (hereinafter, a pressure sensor 245) so as to allow the gas to be set at a reduced atmosphere with a predetermined pressure, and is controlled by a pressure control unit 123 of the second controlling computer 120.

Rotating means (hereinafter, a rotation shaft 254) is coupled to the seal cap 219, and by the rotation shaft 254, a substrate holder (hereinafter, a boat 217) and wafers 200 held on the boat 217 are rotated. Moreover, the seal cap 219 is coupled to elevating means (hereinafter, a boat elevator 225), which elevates and falls the boat 217. Speeds of the rotation shaft 254 and the boat elevator 225 are controlled so as to be set at predetermined values by a drive control unit 124 of the second controlling computer 120.

On an outer circumference of the outer tube 205, heating means (hereinafter, a heater 207) is disposed coaxially therewith. The heater 207 detects temperature in the outer tube 205 by temperature detecting means (hereinafter, a thermocouple 263) so as to set the temperature at a predetermined processing temperature, and controls the temperature by a temperature control unit 121 of the second controlling computer 120. The above-described inner tube 204, outer tube 205 and manifold 209 constitute a processing chamber 201 for housing and processing the wafers 200 supported on the boat 217.

The above-described second controlling computer 120 is controlled by a first controlling computer 110 in a centralized manner. The first controlling computer 110 and the second controlling computer 120 are connected to each other through respective interfaces 111 and 125 thereof.

FIG. 14 is a view showing a hardware configuration of the first controlling computer 110 shown in FIG. 12. As shown in FIG. 14, the controlling computer 110 is composed of a CPU 300, a memory 304, a display/input unit 302 including keys, a display device, and the like, and a recording unit 306 such as a CD device and a HDD device. Recording is performed in the recording unit 306 through a recording medium 308. The controlling computer 110 includes constituents as a computer, which execute a program and the like for controlling the semiconductor manufacturing apparatus, and allow the program and the like to perform the processing for the wafers.

Note that the second controlling computer 120 also includes one or more sets of constituents similar to those of the first controlling computer 110. Moreover, in the second controlling computer 120, the above-described temperature control unit 121, gas flow rate control unit 122, pressure control unit 123, and drive control unit 124 may be individually composed singly, or two or more thereof may be combined. Alternatively, the above-described units may make various formations.

A description will be made of an example of a reduced-pressure CVD processing method by the processing furnace shown in FIG. 12. First, the boat 217 is lowered by the boat elevator 225. The plural wafers 200 are held on the boat 217. Subsequently, the temperature in the processing chamber 201 is set at the predetermined processing temperature while heating the processing chamber 201 by the heater 207. The processing chamber 201 is filled with inert gas in advance by the MFC 241 connected to the gas supply pipe 232, and by the boat elevator 225, the boat 217 is elevated and transferred into the processing chamber 201. Then, inner temperature of the processing chamber 201 is maintained at the predetermined processing temperature. After the inside of the processing chamber 201 is exhausted to a predetermined vacuum state, the boat 217 and the wafers 200 held on the boat 217 are rotated by the rotation shaft 254. Simultaneously, the processing gas is supplied from the gas supply pipe 232. In the inner tube 204, the supplied processing gas flows upward from a bottom thereof, and is supplied uniformly to the wafers 200.

The inside of the processing chamber 201 under the reduced-pressure CVD processing is exhausted through the exhaust pipe 231, the pressure thereof is controlled by the APC 242 so as to obtain predetermined vacuum, and the reduced-pressure CVD processing is performed, thus forming thin films on the wafers 200.

When the reduced-pressure CVD processing is finished as described above, the inert gas is substituted for the gas in the processing chamber 201 and the pressure is set at normal pressure in order to proceed to the reduced-pressure CVD processing for the next wafers 200. Thereafter, the boat 217 is lowered by the boat elevator 225, and the boat 217 and the already processed wafers 200 are taken out of the processing chamber 201. The processed wafers 200 on the boat 217 taken out of the processing chamber 201 are exchanged with unprocessed wafers 200. The unprocessed wafers 200 are elevated in the processing chamber 201 one more time in a similar way to the above, and are subjected to the reduced-pressure CVD processing.

In order to enhance in-plane uniformity of thickness of thin films formed on the wafers 200 in the above-described reduced-pressure CVD processing, preferably, support columns constituting the boat 217 should be adapted not to run over ring-like plates in the case of using a boat with a structure in which the ring-like plates are provided on the support columns, which is similar to that shown in FIG. 15 and FIG. 16. Moreover, since the boat 217 is rotated by the rotation shaft 254, in particular, the support columns are provided more inside than outer circumferences of the ring-like plates, thus making it possible to more appropriately maintain a gap between the boat 217 and the inner tube 204 in the case of the rotation. Thus, generation of particles, and the like owing to rubbing of the support columns and an inner wall of the inner tube 204 can be avoided. Hence, the support columns should not run over the ring-like plates, and a contour of the ring-like plates should be free from deformation and projection.

Incidentally, in the above-described processing furnace, the description has been made of the case where the processing gas flows in the inner tube 204 upward from the bottom thereof. However, the flow of the processing gas is not limited to this. For example, there is also a case where the processing gas flows across the inner tube 204.

FIG. 13 is an explanatory view of main portions of the processing furnace in such a case where the processing gas flows across the inner tube 204. Here, the inner tube 204 is composed such that the upper end thereof is closed, and that a slit-like opening 214 is provided on one side surface thereof.

A description will be made of the gas flow in the inner tube 204. FIG. 13(a) shows a case where the gap t between the inner tube 204 and an outer diameter of the boat 217 is small, and FIG. 13(b) shows a case where the gap is large.

As shown in FIG. 13(a), in the case of jetting the processing gas from a direction parallel to the surfaces of the wafers 200, it is necessary to minimize the gap t between the inner tube 204 and the outer diameter of the boat 217 in order to uniform the flow of the processing gas. This is for the following purpose. After the processing gas is introduced along ring-like plates 13 and passes through the surfaces of the wafers 200, the processing gas should be led out of the slit-like openings 214 provided on the inner tube 204 and exhausted from the space 250 while being left as it is without receiving disturbance on the flow thereof. As opposed to this, when the gap t is large as shown in FIG. 13(b), a down flow 218 as shown by an arrow occurs in a space 249 between the inner tube 204 and the outer diameter of the boat 217, and the exhaust becomes nonuniform in the vertical direction in the processing chamber 201, thus affecting the uniformity of the film thickness of the wafers 200.

Also in this case, in order to minimize the above-described gap t and to enhance the uniformity of the film thickness in the wafer surfaces, the support columns constituting the boat 217 should not run over the ring-like plates 13. Moreover, the support columns should not run over, or the contour of the ring-like plates 13 should not be deformed.

In this connection, in the boat 217 of this embodiment, in order to cope with requirements as described above no matter whether the processing gas flows in the inner tube 204 upward from the bottom or passes across the inner tube 204 depending on the structure of the inner tube 204, wafer support portions as substrate support portions are fixedly attached not onto the ring-like plates 13 but directly onto the support columns 15. Moreover, inner circumferential surfaces of the ring-like plates 13, which are opposite to the support columns, are notched on the periphery of the support columns. Thus, the uniformity of the film thickness in the wafer surfaces can be enhanced in the semiconductor manufacturing apparatus. In particular, in a batch type semiconductor manufacturing apparatus including such a vertical furnace as in this embodiment, requirements for enhancement of a film-forming rate (enhancement of a deposition rate) and enhancement of wafer quality can also be coped with.

A description will be made below of the boat of this embodiment by using FIG. 1 and FIG. 2. FIG. 1 is an explanatory view of one ring-like plate: FIG. 1(a) is a side view of main portions of the boat, in which attention is paid to one ring-like plate; and FIG. 1(b) is a plan view including the support columns. FIG. 2 is an entire configuration view of the boat.

The boat 217 is made of, for example, quartz, and as shown in FIG. 2, includes a bottom disk 17 and a top disk 11 as two parallel plates, and plural, for example, three support columns 15 provided substantially vertically between the bottom disk 17 and the top disk 11. The support columns 15 have a columnar shape. In order to stably and simply support the ring-like plates 13, it is particularly preferable that the number of support columns 15 be three; however, the number may be more than three.

The three support columns 15 are arrayed and fixed approximately semi-circularly onto the bottom disk 17. The top plate 11 is fixed on upper ends of the three support columns 15. On center portions of the bottom disk 17 and the top disk 11, circular holes 12 and 14 for facilitating the processing gas to enter into the boat 217 are individually formed. Between the bottom disk 17 and the top disk 11, the plural ring-like plates 13 provided at a predetermined interval in a substantially horizontal attitude at multi-stages are fixedly attached onto the support columns 15.

On each of the support columns 15, plural wafer support portions 16 capable of mounting the plural wafers 200 substantially horizontally at a predetermined interval in the vertical direction are protruded at multi-stages. As shown in FIG. 1, each of the wafer support portions 16 has a columnar shape, and is protruded toward the center of the boat 217, that is, the center of the ring-like plate 13. In this case, in the support column 15, the wafer support portion 16 is provided for each of the wafers 200. Specifically, three wafer support portions 16 are protruded at one stage. By supporting the outer circumference of the wafer 200 on the three wafer support portions 16 thus protruded, the wafer 200 is mounted thereon. It is preferable that the wafer support portions 16 maintain horizontalness thereof. By maintaining the horizontalness, such interference that each wafer contacts the wafer support portion 16 can be avoided when the wafer is carried, and in addition, a uniform gas flow can be ensured on each wafer in a state where the wafers are mounted on the boat 217.

The above-described ring-like plates 13 are arranged below positions of the support columns 15, where the respective wafer support portions 16 are arranged, and are provided substantially horizontally at a predetermined interval with respect to the wafers 200 supported by the wafer support portions 16. Each ring-like plate 13 is formed into a substantial circular shape in which the center is opened, and surrounds the three support columns 15 by housing the three support columns 15 on the inner circumferential surface of the ring-like plate 13. As in this embodiment, the ring formed substantially circularly over the overall circumference of the wafer is provided, thus making it possible to reduce the tendency that the film thickness of the peripheral edge of the wafer is thickened.

On the inner circumferential surface of the ring-like plate 13, which is opposite to the support columns 15, or on the inner circumferential surface thereof close to the support columns 15, or on the inner circumferential surface thereof proximate to the support columns 15, notches 20 formed by notching the ring-like plate 13 on the periphery of the support columns 15 are formed for the purpose of inserting the three support columns 15 into the ring-like plate 13. As shown in FIG. 1(b), totally three notches 20 are formed, which are one on an opposite side to a loading/unloading side of the wafer on a center line 21 of the ring-like plate 13, and two at symmetrical positions with respect to the center line 21. The notches 20 are formed from the inside of the ring-like plate 13 so that the support columns 15 can be housed within a plate width of the ring-like plate 13. The notches 20 do not reach the outside of the ring-like plate 13. Moreover, in order to reduce an adverse effect to the film thickness, it is preferable that the support columns 15 be provided within the width between the inner and outer diameters of the ring-like plates 13. Moreover, since the boat 217 is rotated by the rotation shaft 254, in particular, the support columns are provided on the inside of the ring-like plate rather than on the outside thereof, thus making it possible to more appropriately maintain the gap between boat 217 and the inner tube 204 in the case of the rotation. Thus, the generation of the particles, and the like owing to the rubbing of the support columns and the inner wall of the inner tube 204 can be avoided. Hence, the support columns should not run over the ring-like plate, and the contour of the ring-like plate should be free from the deformation and the projection.

FIG. 3 is a perspective view showing the periphery of the support column 15 in the vicinity of the above-described wafer support portion 16. As already described, the wafer support portion 16 is protruded on the support column 15. Here, the wafer support portion 16 as a separate member from the support column 15 is fixedly attached onto the support column 15, and the wafer support portion 16 is protruded on the support column 15. The ring-like plate 13 is disposed below the position of the support column 15, where the wafer support portion 16 is arranged, and the ring-plate 13 is provided substantially horizontally at the predetermined interval with respect to the wafer supported on the wafer support portion 16.

Moreover, the notch 20 is formed on the periphery of the support column 15 on the inner circumferential surface of the ring-like plate 13. The notch 20 is composed of an approximately circular or approximately semi-circular fitting portion 20a as a hole into which the support column 15 is fitted, and an opening 20b which opens the fitting portion 20a to the inner circumferential direction of the ring-like plate 13. When the opening 20 is viewed from the above and the wafer support portion 16 is projected on the opening 20b in a state where the support column 15 is fitted to the fitting portion 20a, it is preferable that the wafer support portion 16 is housed in the center of the opening 20b, and that an open width of the opening 20b is larger than the width of the wafer support portion 16. When the opening 20b which opens in the inner circumferential direction of the ring-like plate 13 is provided on the notch 20 as described above, the gas which has hit on the wafer support portion 16 from the above goes around both sides of the wafer support portion 16, and directly flows downward through the opening portion 20b.

Accordingly, turbulence becomes difficult to occur on the wafer support portion 16. Hence, a difference in flow of the processing gas is eliminated between a portion having the support column 15 with the wafer support portion and the other portion. In particular, as in the illustrated example, it is preferable that the opening 20b open in a fan shape to the inner circumferential surface side. This is because, when the opening 20 opens in the fan shape, the turbulence becomes more difficult to occur on the wafer support portion 16, and the difference in flow of the processing is eliminated more between the portion having the support column 15 with the wafer support portion and the other portion.

Moreover, as shown in FIG. 5, a tip of the wafer support portion 16 formed into the columnar shape should be rounded (R) or chamfered (C). Moreover, with regard to a fixing angle of the columnar wafer support portion 16 to the support column 15, each wafer support portion 16 may be provided parallel to the wafer 200 as shown in FIG. 5, or each wafer support portion 16 may be fixed to the support column 15 so as to be inclined downward by θ, as shown in FIG. 6.

Note that FIG. 3 shows an embodiment in which the columnar wafer support portion 16 separate from the support column 15 is fixedly attached to the support column 15. However, the present invention is not limited to this. As shown in FIG. 4, the support column 15 and the wafer support portion 16 may be formed into an integral member 18. In this case, in order to facilitate a process thereof, the wafer support portion 16 should be formed not into the columnar shape but into an approximately triangular plate shape, a base side of the approximate triangle should be integrated with the support column 15, and an apex side of the approximate triangle should be directed to the inside of the ring-like plate 13 in the diameter direction. Moreover, the wafer support portion 16 is not only parallel to the wafer but also may be processed so as to be inclined downward by θ in a similar way to that in FIG. 6.

In order to fabricate the above-described boat 217, here, the ring-like plates 13 are temporarily fixed horizontally at the multi-stages by using a jig (not shown). There is adopted a method of fitting and welding, to the notches 20, the three support columns 15 from the inside of the temporarily fixed ring-like plates 13 at the multi-stages. Specifically, the plural ring-like plates 13 on which the notches 20 are formed are prepared. The plural ring-like plates 13 are temporarily fixed by the jig in a state of being aligned and stacked so that the respective notches 20 can vertically coincide with one another. The three support columns 15 are fixed to the bottom disk 17 while being arrayed semi-circularly. In this case, the wafer support portions 16 protruded on the support columns 15 are adapted to be directed to the inside of the ring-like plate 13 in the diameter direction. The support columns 15 are fitted to the notches 20 of the plural ring-like plates 13 fixed temporarily, and the support columns 15 thus fitted are fixed to the ring-like plates 13 by the notched portions. Each of the ring-like plates 13 is fixed so as to be located at a just intermediate portion between the plural wafer support portions 16 provided vertically. The top disk 11 is fixed to the columns 15. When the jig is detached, the boat in which the large number of wafers are stacked at the multi-stages is completed. Note that fixing of the boat members, which includes the fixing of the ring-like plates 13, is performed by mutual welding of quartz glass. No particular limitations are imposed on materials of the ring-like plates, the support columns, the top disk, and the bottom disk (that is, materials constituting the boat 217) as long as the materials are heat-resistant. However, besides the quarts, heat-resistant materials such as silicon carbide (SiC), alumina ($Al_2O_3$) and ceramics are preferable.

Even if the ring-like plates are used, each of the wafer support portions and the support columns adversely affects the film thickness of the wafers. In this case, if the wafer support portions are attached onto the ring-like plates, and the wafer support portions are scattered so as not to be superposed on the support columns, then the notches are provided on the inner circumferential surfaces of the ring-like plates on the periphery of the attached portions of the wafer support portions, thus making it possible to reduce the adverse effect of the wafer support portions. However, since the notches are not ones to reduce the adverse effect of the support columns, it is impossible to reduce the adverse effect of the support columns even with the notches.

From this viewpoint, according to this embodiment, the wafer support portions are provided on the support columns, and the wafer support portions and the support columns, each of which adversely affects the film thickness of the wafers, is thus integrated together. In addition, the notches are provided on the inner circumferential surfaces of the ring-like plates on the periphery of the attached portions of the wafer support portions, onto which the support columns are fitted. Accordingly, as compared with the case of scattering the wafer support portions and the support columns, it is made possible to collectively reduce the adverse effect to be given to the film thickness from both of the wafer support portions and the support columns.

Incidentally, the reason why the wafer mounting portions have not been heretofore provided on the support columns is as follows.

At the beginning, a substrate holder called a normal boat has been used as one to mount the wafers at the multi-stages. The normal boat has a shape in which grooves (wafer mounting portions) are provided on plural support columns arranged in an arc shape. Accordingly, at the time of the film forming, the film thickness on the periphery of the support columns has tended to be thinned owing to the effect of the support columns, and the film thickness of the peripheral edges of the wafers, where there are no support columns, has tended to be thickened.

In this connection, for the purpose of reducing the effect of the support columns to the film thickness, there has been proposed the ring boat, in which the rings having the support claw portions for mounting the wafers provided thereon are laid on the normal boat, and the wafers are made apart from the support columns. Specifically, the ring boat is one in which the wafer mounting portions are transferred from the support columns to the rings. In order to reduce the effect of the support columns to the film thickness of the films on the wafers on the periphery of the support claw portions, the support claw portions are provided at spots going around the support columns. By adopting the ring boat, it has been made possible to make an improvement to thicken the film thickness of the portions on the periphery of the support columns, which has been thinned in the normal boat. Moreover, it has been made possible to make an improvement to thin the film thickness of the peripheral edges of the wafers, where there are no support columns.

However, in the ring boat, though it has been made possible to make the improvement to thin the film thickness of the peripheral edges of the wafers, where there are no support columns, the flow of the gas on the periphery of the support claw portions has become nonuniform owing to the effect of the support claw portions provided on the rings, causing a new problem that the film thickness of the wafers on the periphery of the support claw portions is thinned too much. Moreover, the nonuniformity of the gas flow owing to the effect of the support columns cannot be solved completely.

Although the film thickness on the periphery of the support columns of the ring boat has been improved to some extent since the film thickness has been thickened as compared with that of the normal boat, it cannot be said that a degree of the improvement has been sufficient, and the film thickness on the periphery of the support columns of the ring boat has been still thin as compared with the film thickness of the other portions.

As described above, in the normal boat, in which the grooves are provided on the support columns, and the wafers are thus supported, the effect of the support columns to the film thickness is large. In order to avoid the effect, a concept of the ring boat is to make the wafers apart from the support columns by arranging the rings in the inside of the support columns and mounting the wafers on the rings. Hence, the boat of the type adopting the rings is one proposed based on the concept to transfer the wafer support portions from the support columns to the rings.

As described above, in this embodiment, the wafer support portions 16 are fixedly attached onto the support columns, and the support columns and the wafer support portions which are two main factors of the adverse effect given to the film thickness of the wafers are thus integrated together. Accordingly, the adverse effect to the film thickness of the wafers can be reduced. Moreover, the inner circumferential surfaces of the ring-like plates 13 in the vicinities of the support columns are notched. Accordingly, the effect of the support columns 15 and the wafer support portions 16 to the gas flow is suppressed in the portions where the support columns 15 and the wafer support portions 16 are present, and it has been made possible to obtain, on the wafers 200, a similar film thickness to that in the portions where the wafer support portions 16 and the support columns 15 are not present.

A description will be specifically made of the above by using FIG. 8. FIG. 8 is conceptual views of the gas flow when the processing gas flows in a direction from the wafers 200 to the ring-like plates 13 and is exhausted downward in the case where the processing gas flows across the inner tube. FIG. 8(a) shows the gas flow in the portion where the support column 15 and the wafer support portions 16 are not present, and FIG. 8(b) shows the gas flow in the portion where the support column 15 and the wafer support portions 16 are present. It is common knowledge that a film-forming reaction by the processing gas occurs even on the surface of quartz in the CVD processing and the like. However, owing to the fact that the processing gas to originally react on the wafers 200 reacts on the surface of quartz, an amount of the processing gas supplied to the wafer portions in the vicinities of the support columns 15 and the wafer support portions 16 is reduced. As a result, the film thickness of the wafer portions in the vicinities of the support columns 15 and the wafer support portions 16 tends to be thinned.

In this embodiment, the notches 20 are provided on the ring-like plates 13, and in FIG. 8, a distance LB between each wafer end and each support column 15 in the portions where the support columns 15 and the wafer support portions 16 are present is made larger than a distance La between each wafer end and each inner circumferential surface of the ring-like plates 13 in the portions where the support columns 15 and the wafer support portions 16 are not present, and conductance is thus made large. Thus, the amount of the processing gas flowing in the portions where the support columns 15 and the wafer support portions 16 are present is increased, thus making it possible to equalize a film thickness of each wafer peripheral edge Wb in the portions where the support columns 15 and the wafer support portions 16 are not present and a film thickness of each wafer peripheral edge Wa in the portions where the support columns 15 and the wafer support portions 16 are present to each other.

Note that, though the description has been made of the case where the processing gas flows in the direction from the wafers 200 to the ring-like plates 13 when the processing gas flows across the inner tube in FIG. 8, the above description can also be applied to the case where the processing gas flows in a direction from the ring-like plates 13 to the wafers, and to the case where the processing gas flows upward from the bottom.

Hence, no matter whether the processing gas flows in the inner tube 204 upward from the bottom or flows across the inner tube 204, the above-described requirement to enhance the uniformity of the film thickness in the wafer surfaces can be coped with. Moreover, the plural ring-like plates are provided on the support columns at the predetermined interval in the vertical direction, and accordingly, the uniformity of the film thickness among the surfaces of the plural wafers can also be improved.

Moreover, as shown in FIG. 8, with regard to a relationship in vertical distance between each ring-like plate 13 and each wafer 200, since the processing gas is supplied to flow between an upper surface of each wafer and a lower surface of each ring-like plate disposed above the wafer 200, for example, when a distance between the upper surface of the wafer and the lower surface of the ring-like plate disposed above the wafer 200 is small, the gas directly hits on the ring-like plate, and the gas becomes prone to be disturbed, thus adversely affecting the uniformity of the film thickness. Hence, it is preferable to make an arrangement so that the distance between the upper surface of the wafer and the lower surface of the ring-like plate disposed above the wafer 200 can be large. In particular, as shown in FIG. 9, when an arrangement is made so that the upper surface of the wafer and the upper surface of the ring-like plate can coincide with each other, that is, can be flush with each other, the uniformity of the in-plane film thickness becomes much better. Moreover, a high film-forming rate can be maintained, that is, the film-forming rate can also be improved.

FIG. 10 shows a comparison result from an evaluation on the film forming by the boat with the conventional shape shown in FIG. 15 and FIG. 16 and the boat with the shape of this embodiment, which is shown in FIG. 1 and FIG. 2. In this evaluation, targets thereof were three wafers located on three spots which are the top (TOP), center (CTR), and bottom (BTM) of the boat 217 among the plural wafers mounted on the boat 217. The film thicknesses of the wafers after being subjected to the CVD processing, which were located at these positions, were measured, and the in-plane uniformities were obtained. An axis of abscissas represents the positions of the wafers, and an axis of ordinates represents the in-plane uniformities. In the boat with the conventional shape, the film thicknesses were thin in the portions of the support claw portions and the support columns, and the in-plane uniformities were approximately 2.0%. As opposed to this, in the boat with the shape of this embodiment, the effect of the wafer support portions and the support columns was suppressed, and the in-plane uniformities were approximately 1%, which was a good result.

Note that film-forming conditions such as a gas type, a gas amount, a pressure, a temperature, and a time at the time of performing the evaluation are silane ($SiH_4$) of 400 cc, phosphine ($PH_3$) of 50 cc, the pressure at 300 Pa, the temperature in the processing chamber at 530° C., and the film-forming time (deposition time) for 30 min for a DPOLY film (doped polysilicon film). The evaluation shows the results when the distance La between the ring-like plate 13 and the wafer 200 in the portion where the support column is not present, which is shown in FIG. 8(*a*), is equal to 4 mm, and when the distance Lb between the support column 15 and the wafer 200 in the portion where the support column 15 is present, which is shown in FIG. 8(*b*), is equal to 8.5 mm.

Moreover, when the optimum value of La was evaluated by an experiment, in a film-forming evaluation of a wafer with a diameter of 300 mm, it was found that the film thickness of the wafer peripheral edge became thinner than the film thickness of the wafer center when La was less than 2 mm, and that, on the contrary, the film thickness of the wafer peripheral edge became thicker than the film thickness of the wafer center when La exceeded 7 mm. From this fact, it can be said that 2 to 7 mm is the optimum as the distance La when the diameter of the wafer is 300 mm. Moreover, it is essential that Lb be larger than La. This is because it is necessary to increase the conductance of a gas passage on the side where the support columns 15 and the wafer support portions 16, which become obstacles to the gas flow, are present.

Note that, in the above-described embodiment, as shown in FIG. 7(*a*), each support column 15 fitted to the notch 20 is formed into the columnar shape, however, the shape of the support column 15 is not limited to the columnar shape. The shape of the support column 15 just needs to be a shape, in which the notches 20 are not embedded in the support columns 15, the openings 20*b* in the vicinities of the fixed portions of the wafer support portions 16 are ensured, and the flow rate of the processing gas flowing in the vicinities of the support columns 15 and the wafer support portions 16 is increased. For example, as shown in FIG. 7(*b*) and FIG. 7(*c*), a cross section of a support column 19 may be formed into an approximately semi-columnar shape, and the wafer support portion 16 may be attached onto the center of the semi-circle. Moreover, the wafer side of the cross section of the support column may be formed into a scooped out shape. In this case, as shown in FIG. 7(*d*), even if the support column 19 is formed into an approximate half-pipe shape, and the wafer support portion 16 is protruded on a concave side thereof, a similar effect can be obtained.

Moreover, preferably, as shown in FIG. 7, the wafer support portion 16 is located on the center (vertically symmetrical in FIG. 7) of the support column 15 or 19 or the notch 20. Then, the effect can be obtained more.

Moreover, in this embodiment, each wafer support portion 16 is fixedly attached onto the support column 15, and accordingly, it is easy to achieve accuracy on the wafer mounting position. This is because each of a pair of the support column 15 and the wafer support portion 16 and a pair of the support column 15 and the bottom disk 17 can be welded together by bringing surfaces thereof in which the accuracy is achieved by machining into contact with each other. In terms of this point, it is difficult to achieve the accuracy of the wafer mounting position in the one of the conventional example, which is shown in FIG. 16. In many cases, for the above-described conventional one, there is adopted a step of polishing the surface of the holder plate 33 into a mirror surface, and attaching the support claw portion 34 thereonto with pressure (a method of joining mirror-surfaced members to each other while applying heat and force thereto) in the case of joining each support claw portion 34 to the holder plate 33. Accompanied with the above, for the holder plate 33, for example, a step of polishing a raw material with a thickness of 3 mm into a mirror-surface plate with a thickness of 2 mm is inevitably introduced. This is the reason why it is difficult to achieve the accuracy in the conventional example. Moreover, since the one of the conventional example requires the above-described steps, it has taken an extremely long time to fabricate the same, and cost thereof has also been high. As opposed to this, in this embodiment, what to do is only to fixedly attach each wafer support portion to the support column, and to join each ring-like plate with a simple structure, where there are no wafer support portions, to the support column on which the wafer support portion is provided. Accordingly, the above-described steps can be omitted, the fabrication time can be shortened to a great extent, and the cost reduction can be realized.

Moreover, the wafer support portions 16 are fixedly attached onto the support columns 15, thus making it possible to set the number of support columns 15 at three that is the minimum number capable of holding the wafers 200 in a symmetrical shape. In order to prevent the gas flow from affecting the wafers, it is necessary to provide the support columns 15 at the positions symmetrical with respect to the center line of the ring-like plates 13. In this embodiment, as shown in FIG. 1(b), the support column 15 can be provided to be stacked on each wafer support portion 16 provided on the opposite side to the loading/unloading side of the wafers on the center line of the ring-like plates 13. This is the reason why the number of support columns 15 can be set at three. Hence, in the case of providing the wafer support portions 16 on the support columns 15, the number of portions in which the gas flow affects each wafer can be set at three that is the minimum. Moreover, the number of wafer support portions 16 is set at three, and the wafer can be thus held by three-point support, thus making it possible to stably support the wafer.

Moreover, in the conventional holder boat, the support claw portions 34 and each wafer have been brought into surface contact with each other, and sliding therebetween and the like when the wafer is inserted has caused the generation of the particles. Moreover, in the case of the CVD processing and the like, since the surface contact has been brought in the contact portions of the support claw portions 34 with the wafer, it has been impossible to form the film on the back surface of the wafer. Therefore, a distortion owing to heat has occurred between the portion subjected to the film forming and the portion that is not subjected to the film forming on the back surface of the wafer, causing exfoliation of the film.

In terms of this point, in this embodiment, as shown in FIG. 5, the fixing angle of each columnar wafer support portion 16 is set parallel to the wafer, and the tip of the wafer support portion 16 is rounded or chamfered to make the contact surface into a line, and accordingly, the particles generated owing to the sliding can be reduced to a great extent. Moreover, since the contact portion of the wafer support portion 16 with the wafer makes the line contact, the region of the back surface of the wafer, which cannot be subjected to the film forming, can be reduced. Therefore, the distortion generated owing to the heat between the portion subjected to the film forming and the portion that is not subjected to the film forming on the back surface of the wafer can be reduced, and factors causing a damage to the wafer itself and the exfoliation of the film can be reduced.

Moreover, as shown in FIG. 6, when the fixing angle of each columnar wafer support portion 16 is inclined downward by θ, the wafer and the wafer support portion 16 are brought into point contact with each other, and accordingly, the particles can be further reduced.

Moreover, the boat of this embodiment can improve the uniformity of the film thickness in the wafer surface by the simple configuration in which the wafer support portions are provided on the support columns. Accordingly, the size of the boat is not increased, and the size of the apparatus is not increased, either. Hence, the deterioration of the throughput owing to an excessive amount of heat is eliminated.

Note that, though the substrate processing apparatus of the present invention is particularly suitable for the vertical apparatus, the substrate processing apparatus is also applicable to the other substrate processing apparatuses. Moreover, with regard to the target film type, the substrate processing apparatus is naturally applicable over the general CVD film including a D-POLY film, a Si3N4 film, a HTO film (a high-temperature oxidation film), and the like. Besides the above, the substrate processing apparatus is also applicable to an annealing furnace, a diffusion furnace, and the like. In particular, the substrate processing apparatus of the present invention can enhance the deposition rate of the CVD film from the conventional 20 Å/min to 50 Å/min. Accordingly, the substrate processing apparatus is effective in terms of a method of enhancing the deposition rate. Moreover, the substrate processing apparatus can enhance the uniformities of the inside of the wafer surface, between the wafer surfaces, and between the batches to within ±1% from ±3% of the conventional substrate processing apparatus using the normal boat or the ring boat. Accordingly, the substrate processing apparatus of the present invention is effective also in terms of a method of enhancing the wafer quality.

BRIEF DESCRIPTION OF THE DRAWINGS

FIG. 1(a) is a side view of main portions of a boat, in which attention is paid to one ring-like plate; and FIG. 1(b) is a plan view of the ring-like plate including support columns.

FIG. 7(a) is an explanatory view showing a modification example in a case where the support column is columnar; FIG. 7(b) and FIG. 7(c) are explanatory views showing modification examples in a case where cross sections of the support columns are approximately semi-circular; and FIG. 7(d) is an explanatory view showing a modification example in a case where the support column is like a half pipe.

FIG. 8(a) is an explanatory view showing a gas flow in a portion where the wafer support portions and the support column are not present; and FIG. 8(b) is an explanatory view showing a gas flow in a portion where the wafer support portions and the support column are present.

FIG. 9(a) is an explanatory view showing a gas flow in a portion where the wafer support portions and the support column are not present; and FIG. 9(b) is an explanatory view showing a gas flow in a portion where the wafer support portions and the support column are present.

FIG. 13(a) shows a case where a gap t between the inner tube and an outer diameter of the boat is small; and FIG. 13(b) shows a case where the gap is large.

FIG. 15(a) is a side view; and FIG. 15(b) is a plan view.

EXPLANATION OF REFERENCE NUMERALS

Figure 1:
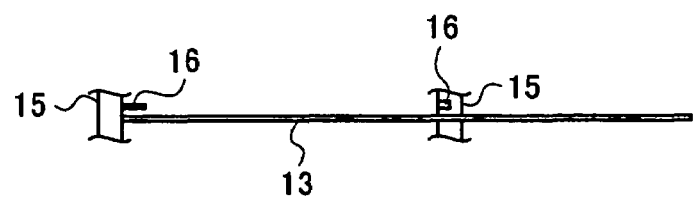
FIG. 1 is explanatory views of a ring-like plate according to an embodiment.
Figure 1:
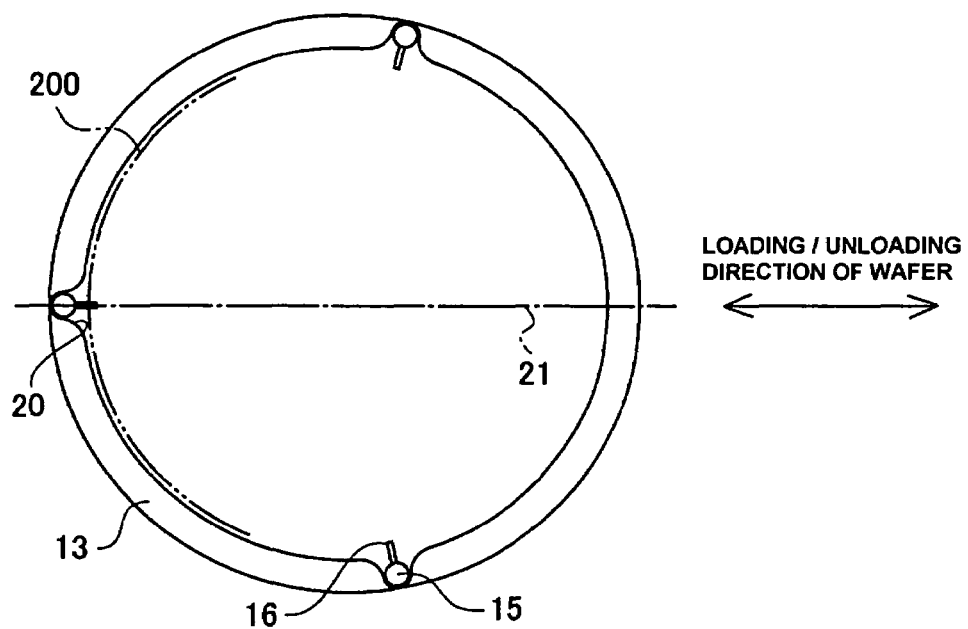
Figure 2:
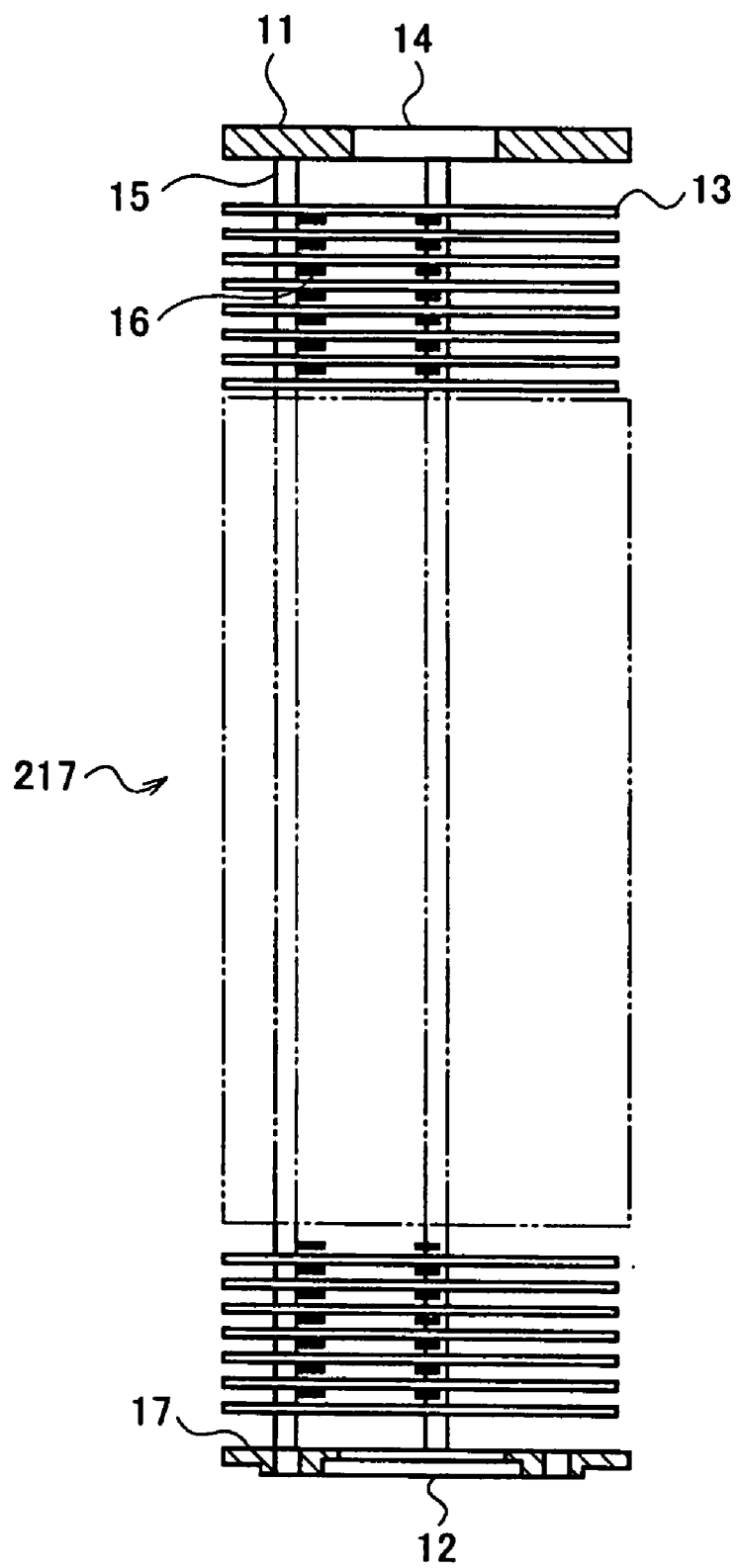
FIG. 2 is an entire configuration view of the boat as a substrate holder according to the embodiment.
Figure 3:
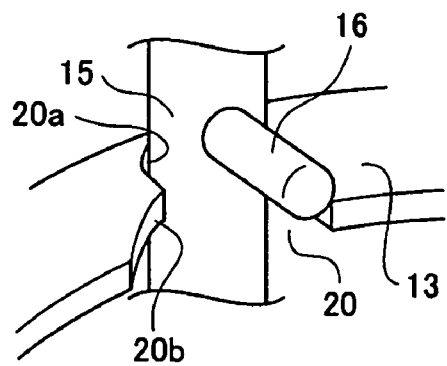
FIG. 3 is a perspective view showing a periphery of the support column in a vicinity of a wafer support portion according to the embodiment.
Figure 4:
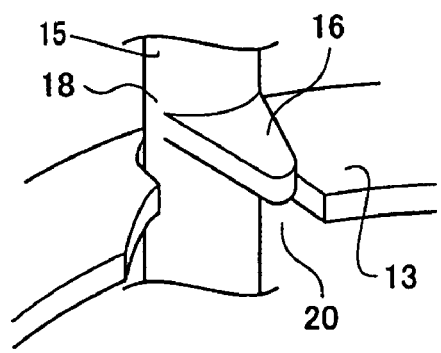
FIG. 4 is a perspective view showing the periphery of the support column in the vicinity of the wafer support portion according to a modification example of the embodiment.
Figure 5:
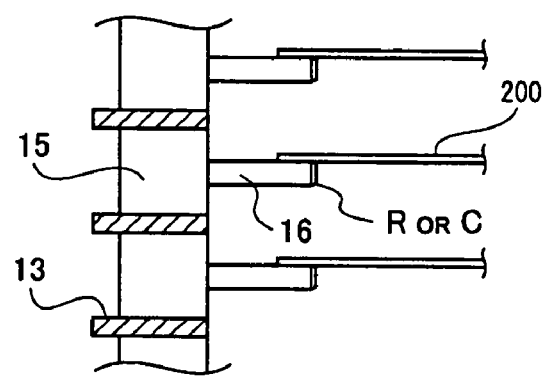
FIG. 5 is an explanatory view showing a state where the boat according to the embodiment mounts wafers thereon.
Figure 6:
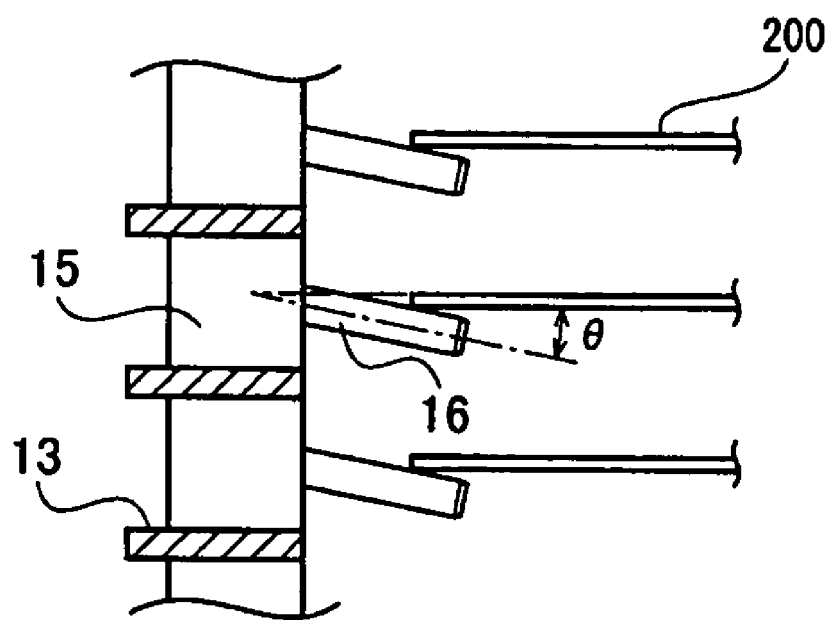
FIG. 6 is an explanatory view showing a state where a boat according to a modification example of the embodiment mounts the wafers thereon.
Figure 7:
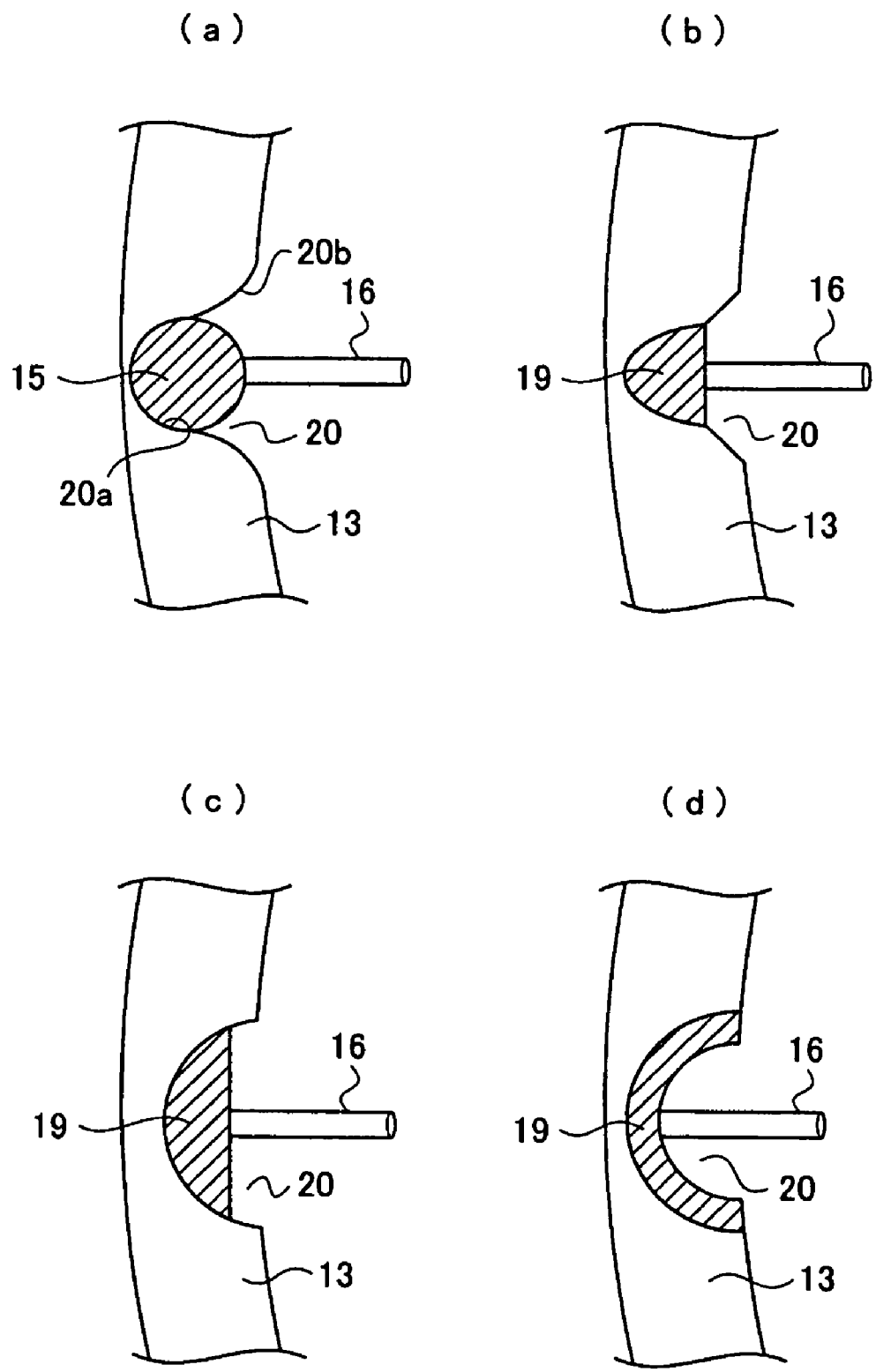
FIG. 7 is plan views of main portions in the vicinities of support column portions, showing modification examples of a support column shape according to the embodiment.
Figure 8:
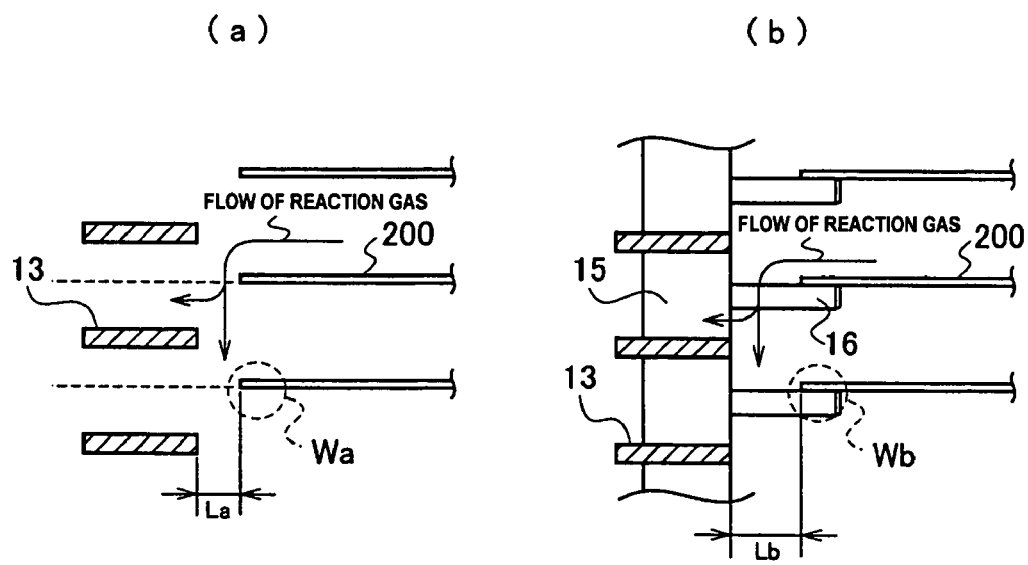
FIG. 8 is explanatory views showing gas flows according to the embodiment.
Figure 9:
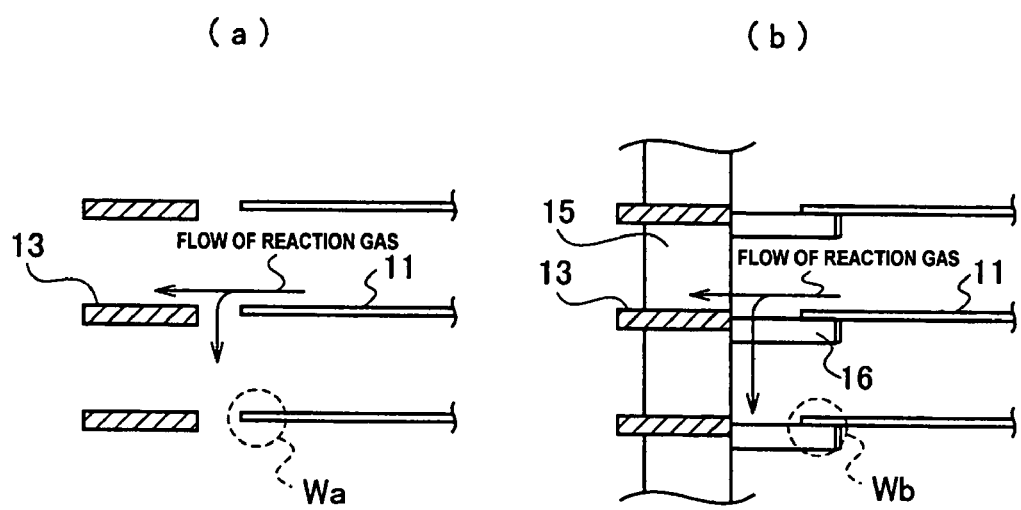
FIG. 9 is explanatory views showing a gas flow according to the embodiment.
Figure 10:
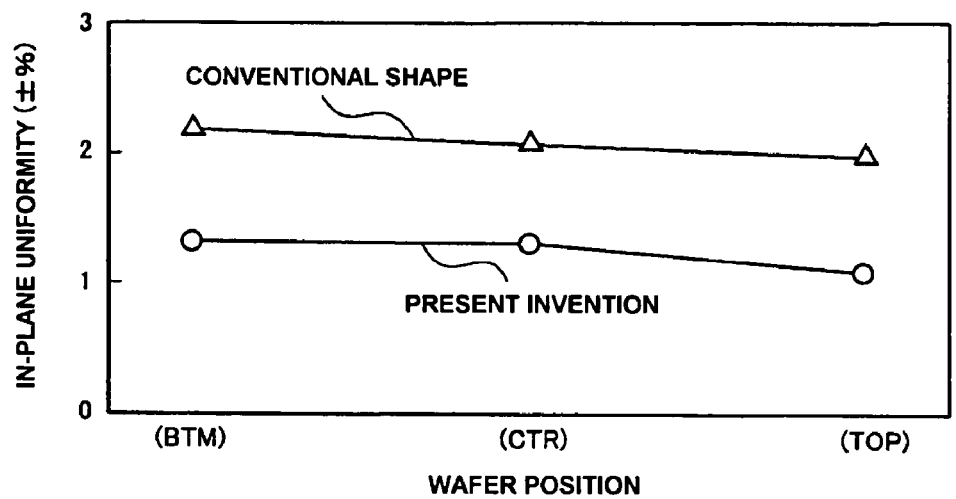
FIG. 10 is a comparison chart of uniformities of thin film thicknesses in the wafers between processing using the boat of the embodiment and processing using a boat of a conventional example.
Figure 11:
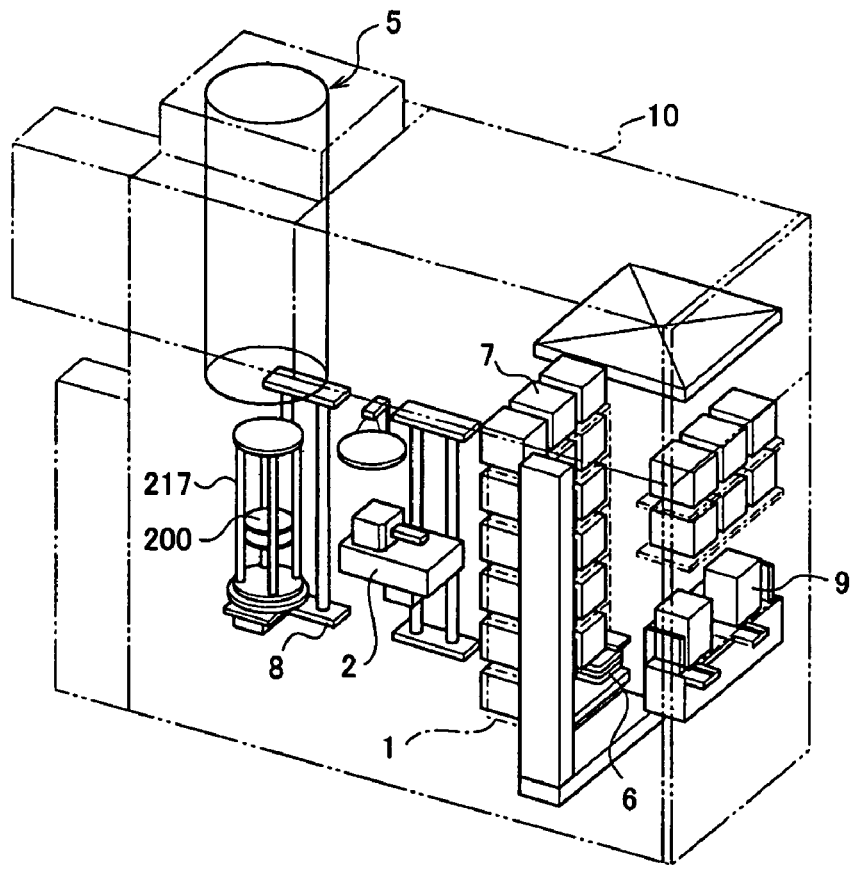
FIG. 11 is a perspective view showing an entire configuration of a semiconductor manufacturing apparatus as a substrate processing apparatus according to the embodiment.
Figure 12:
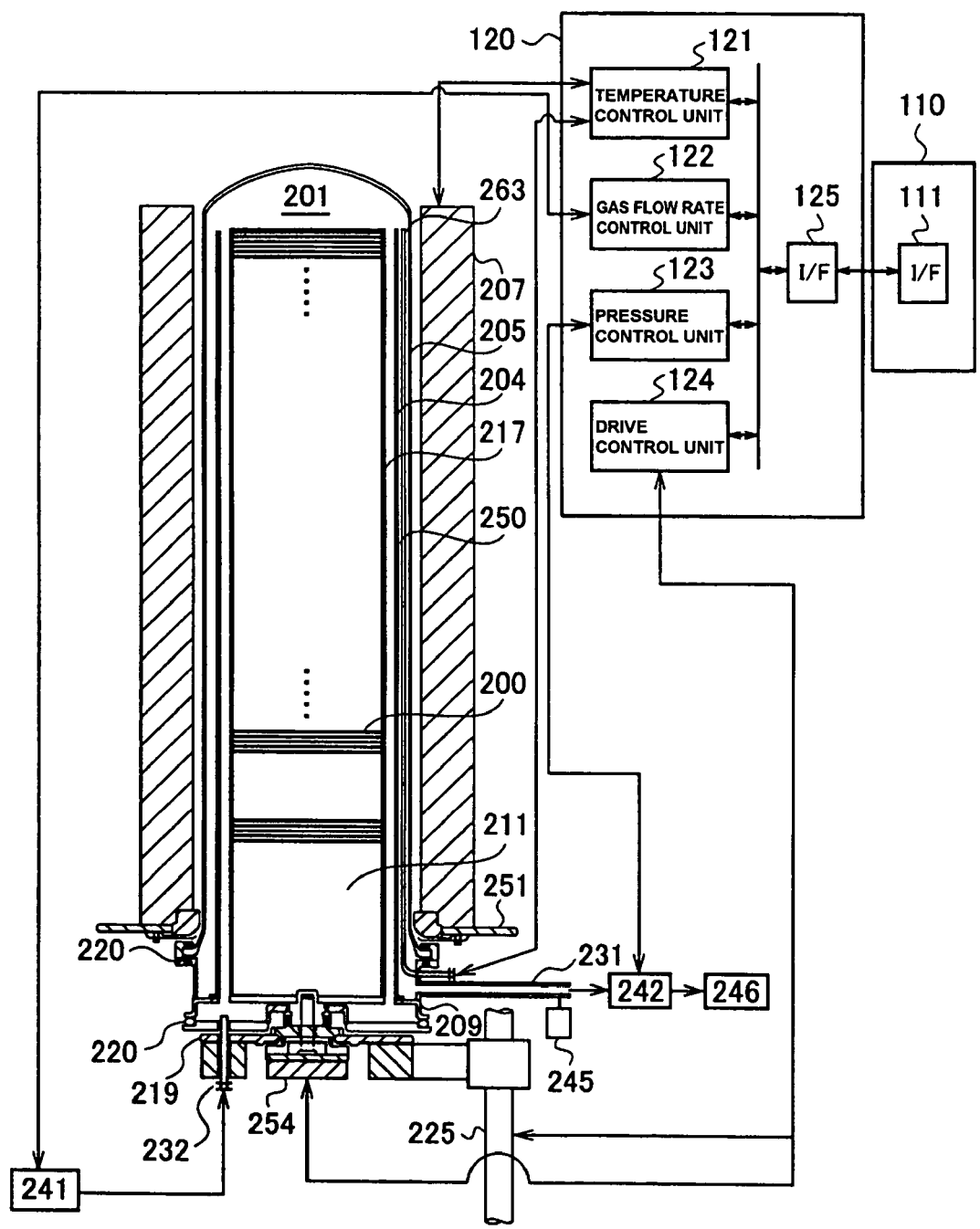
FIG. 12 is a longitudinal cross-sectional view of a reaction furnace including controlling computers according to the embodiment.
Figure 13:
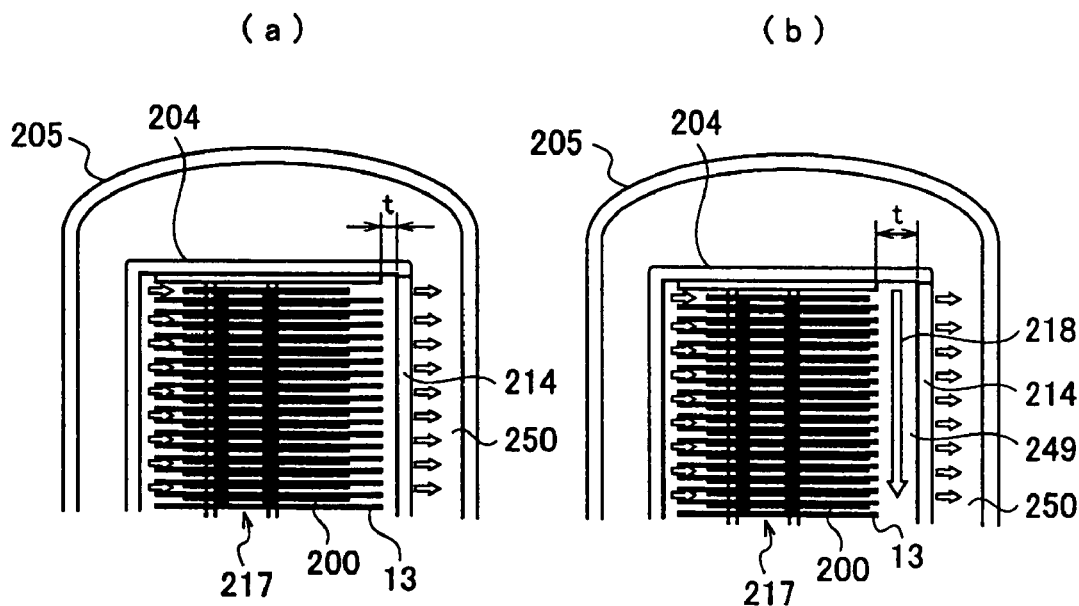
FIG. 13 is explanatory views each showing a relationship between the gas flow and a distance between an inner tube and the ring-like plate in a case where processing gas according to the embodiment flows across the inner tube.
Figure 14:
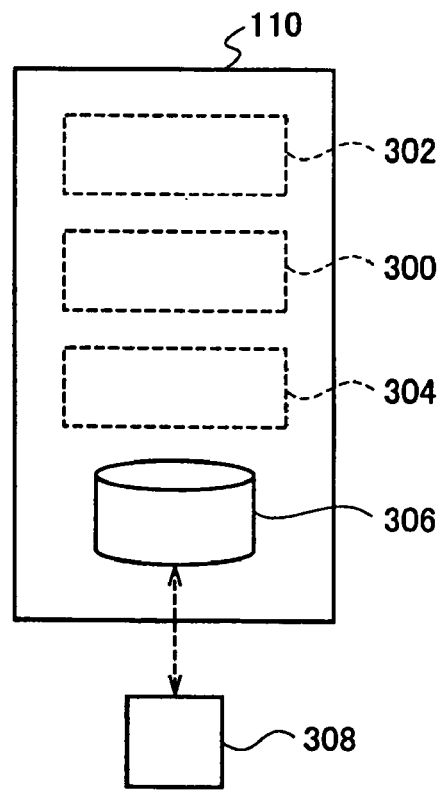
FIG. 14 is a configuration diagram of the first rolling computer according to the embodiment.
Figure 15:
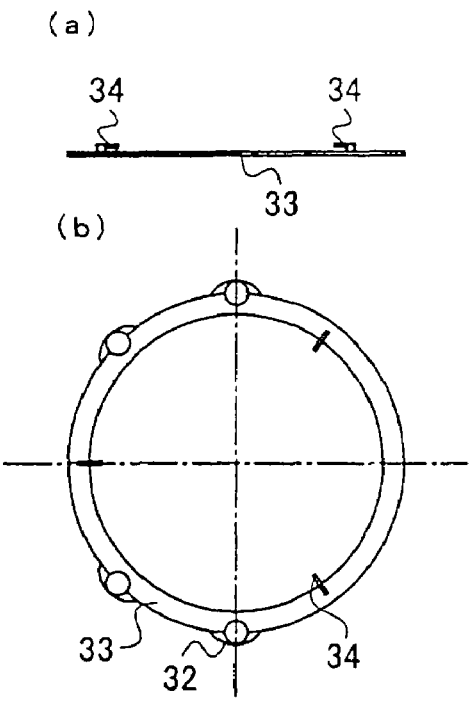
FIG. 15 is explanatory views of a holder plate of the conventional example.
Figure 16:
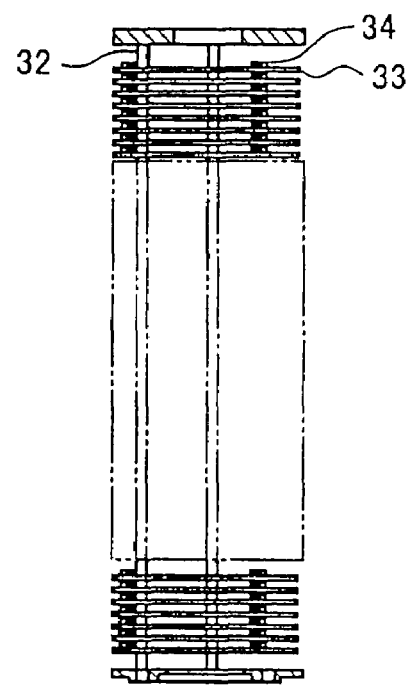
FIG. 16 is an entire configuration view of the boat of the conventional example.

13 RING-LIKE PLATE
15 SUPPORT COLUMN
16 WAFER SUPPORT PORTION (SUBSTRATE MOUNTING PORTION)
200 WAFER (SUBSTRATE)
201 PROCESSING CHAMBER
207 HEATER (HEATING MEANS)
217 BOAT (SUBSTRATE HOLDER)
232 GAS SUPPLY PIPE (GAS SUPPLYING MEANS)

The invention claimed is:

1. A substrate processing apparatus, comprising:
a substrate holder capable of holding plural substrates;
a processing chamber which houses the substrates held by the substrate holder; and
a heater which heats the processing chamber;
wherein the substrate holder includes:
at least three support columns provided substantially vertically;
plural substrate mounting portions which mount the plural substrates substantially horizontally at a predetermined interval, the substrate mounting portions being provided at multi-stages on the support columns so as to protrude from the support columns;
plural ring-like plates which surround the at least three support columns, are provided at multi-stages on the support columns, and are provided substantially horizontally at a predetermined interval with respect to the substrates supported on the substrate mounting portions; and
notches which are formed by notching inner circumferential surfaces of the ring-like plates, the inner circumferential surfaces being opposite to the support columns, on a periphery of the support columns, the support columns being fitted into the notches and being disposed inside an outer periphery of the ring-like plates.

2. The substrate processing apparatus according to claim 1, wherein the substrate mounting portions are columnar shape or approximately semi-columnar shape.

3. The substrate processing apparatus according to claim 2, wherein the substrate mounting portions are inclined downward toward an inside of the ring-like plates in a diameter direction.

4. The substrate processing apparatus according to claim 2, wherein tips of the substrate mounting portions are rounded or chamfered.

5. The substrate processing apparatus according to claim 1, wherein the support columns are composed into an approximately semi-columnar shape, and the substrate mounting portions are protruded on a chord side of the support columns.

6. The substrate processing apparatus according to claim 5, wherein, on the chord side, an inside thereof in a diameter direction of the ring-like plates is scooped out.

7. The substrate processing apparatus according to claim 1, wherein an open width of the notch is larger than a width of the substrate mounting portion.

8. The substrate processing apparatus according to claim 1, wherein an open width of the notch is larger than an outside diameter of the support columns.

9. The substrate processing apparatus according to claim 1, wherein the notch comprises:
a fitting portion as a hole into which the support columns is fitted; and
an opening which opens the fitting portion to the inner circumferential direction of the ring-like plate.

10. A substrate processing apparatus, comprising:
a substrate holder capable of holding plural substrates;
a processing chamber which houses the substrates held by the substrate holder; and
a heater which heats the processing chamber;
wherein the substrate holder includes:
at least three support columns provided substantially vertically;
plural ring-like plates which surround the at least three support columns, are provided at multi-stages on the support columns, and are provided substantially horizontally at a predetermined interval with respect to the substrates held by the substrate holder; and
notches which are formed by notching inner circumferential surfaces of the ring-like plates, the inner circumferential surfaces being opposite to the support columns, on a periphery of the support columns, the support columns being fitted into the notches and being disposed inside an outer periphery of the ring-like plates.

11. The substrate processing apparatus according to claim 10, wherein the support columns are composed into an approximately semi-columnar shape, and the substrate mounting portions are protruded on a chord side of the support columns.

12. The substrate processing apparatus according to claim 11, wherein, on the chord side, an inside thereof in a diameter direction of the ring-like plates is scooped out.

13. The substrate processing apparatus according to claim 10, wherein an open width of the notch is larger than an outside diameter of a corresponding support column.

14. The substrate processing apparatus according to claim 10, wherein the notch comprises:
a fitting portion as a hole into which the support columns is fitted; and
an opening which opens the fitting portion to the inner circumferential direction of the ring-like plate.

15. A substrate holder capable of holding plural substrates, comprising:
at least three support columns provided substantially vertically;

plural substrate mounting portions which mount the plural substrates substantially horizontally at a predetermined interval, the substrate mounting portions being provided at multi-stages on the support columns, so as to protrude from the support columns; and plural ring-like plates which surround the at least three support columns, are provided at multi-stages on the support columns, and provided substantially horizontally at a predetermined interval with respect to the substrates supported on the substrate mounting portions, wherein notches are formed by notching inner circumferential surfaces of the ring-like plates, the inner circumferential surfaces being opposite to the support columns, on a periphery of the support columns, and the support columns are fitted into the notches and being disposed inside an outer periphery of the ring-like plates.

16. The substrate processing apparatus according to claim 15, wherein an open width of the notch is larger than a width of the substrate mounting portion.

17. The substrate processing apparatus according to claim 15, wherein an open width of the notch is larger than an outside diameter of a corresponding support column.

18. The substrate processing apparatus according to claim 15, wherein the notch comprises:
   a fitting portion as a hole into which a corresponding support column is fitted; and
   an opening which opens the fitting portion to the inner circumferential direction of the ring-like plate.

19. The substrate holder according to claim 15, wherein the support columns are composed into an approximately semi-columnar shape, and the substrate mounting portions are protruded on a chord side of the support columns.

20. The substrate holder according to claim 19, wherein, on the chord side, an inside thereof in a diameter direction of the ring-like plates is scooped out.

21. A substrate holder capable of holding plural substrates, comprising:
   at least three support columns provided substantially vertically; and
   plural ring-like plates which surround the at least three support columns, are provided at multi-stages on the support columns, and are provided substantially horizontally at a predetermined interval with respect to the substrates held by the substrate holder,
   wherein notches are formed by notching inner circumferential surfaces of the ring-like plates, the inner circumferential surfaces being opposite to the support columns, on a periphery of the support columns, and the support columns are fitted into the notches and being disposed inside an outer periphery of the ring-like plates.

22. A method of manufacturing a semiconductor device, the method using a substrate processing apparatus including: a substrate holder capable of holding plural substrates; a processing chamber which houses the substrates held by the substrate holder; a heater which heats the processing chamber; and a gas supply pipe which supplies processing gas to the processing chamber heated by the heater, thereby processing the substrate, wherein the substrate holder includes: at least three support columns provided substantially vertically; plural substrate mounting portions which mount the plural substrates substantially horizontally at a predetermined interval, the substrate mounting portions being provided at multi-stages on the support columns so as to protrude from the support columns; plural ring-like plates which surround the at least three support columns, are provided at multi-stages on the support columns, and are provided substantially horizontally at a predetermined interval with respect to the substrates supported on the substrate mounting portions; and notches which are formed by notching inner circumferential surfaces of the ring-like plates, the inner circumferential surfaces being opposite to the support columns, on a periphery of the support columns, the support columns being fitted into the notches and being disposed inside an outer periphery of the ring-like plates, the method comprising:
   mounting the substrates on the substrate mounting portions of the substrate holder;
   carrying the substrates mounted on the substrate mounting portions of the substrate holder into the processing chamber;
   heating the processing chamber by the heater; and
   supplying the processing gas to the heated processing chamber by the gas supply pipe, thereby processing the substrate.

* * * * *